United States Patent [19]  
Fulton et al.

[11] 4,125,853  
[45] Nov. 14, 1978

[54] INTEGRATED CIRCUIT TRANSISTOR

[75] Inventors: Alan W. Fulton, Batavia; William J. Ooms, Schaumburg; Ray A. Reed, Bolingbrook, all of Ill.

[73] Assignee: Bell Telephone Laboratories, Incorporated, Murray Hill, N.J.

[21] Appl. No.: 781,788

[22] Filed: Mar. 28, 1977

[51] Int. Cl.$^2$ ............................................ H01L 29/72
[52] U.S. Cl. ..................................... 357/36; 357/35; 357/48
[58] Field of Search ............................. 357/35, 36, 48

[56] References Cited

U.S. PATENT DOCUMENTS

| | | | |
|---|---|---|---|
| 3,524,113 | 8/1970 | Agusta et al. | 357/35 |
| 3,891,480 | 6/1975 | Fulkerson | 357/48 |
| 3,911,470 | 10/1975 | Ruegg | 357/36 |
| 3,994,011 | 11/1976 | Misawa et al. | 357/34 X |

Primary Examiner—Martin H. Edlow  
Assistant Examiner—James W. Davie  
Attorney, Agent, or Firm—John C. Albrecht; Arthur J. Torsiglieri

[57] ABSTRACT

Several embodiments of isolated lateral transistors are shown. The emitter and collector electrodes of each embodiment are formed in the same processing step as the region which isolates the transistor from other structures. Consequently, the emitter and collector electrodes are each relatively heavily doped and extend to an underlying buried layer over which the transistor is formed. The heavy doping and the deep penetration of the collector and emitter diffusions tend to increase transistor efficiency; and since the emitter and collector electrodes are formed in the same processing step as the isolation diffusion, there is a reduction in processing complexity.

4 Claims, 12 Drawing Figures

INTEGRATED CIRCUIT TRANSISTOR

BACKGROUND OF THE INVENTION

This invention relates to improved integrated circuit transistor structure and the manner of manufacture of that structure.

Electrical performance, flexibility of application, ease of manufacture, and cost are all important characteristics of integrated circuits. Nature generally dictates solutions which are compromises among these characteristics and solutions which tend to optimize electrical performance and reproducibility without undue processing complexity are of commercial importance. Furthermore, it is important that a mix of different types of circuits be available on a single chip.

SUMMARY OF THE INVENTION

In accordance with the present invention, the emitter and collector regions of a high performance PNP lateral transistor are formed over a buried tub in a semiconductor body in the same processing step as the isolation regions. The resulting emitter and collector regions are relatively heavily doped and extend from the exposed surface of the body to the buried tub.

Advantageously this structure has good electrical performance since there is no region below the emitter which can collect charge, and therefore increase response time and reduce gain.

In accordance with one aspect of this invention, a frame shaped base contact region extending from the exposed surface of the semiconductor body to the buried tub and deep oxide regions extending from the exposed surface of the body toward the buried tub may be utilized to selectively reduce parasitic transistor action between elements of the transistor and isolation regions.

Advantageously, the selective use of such deep oxide regions permits a tailoring of the saturation characteristics of the transistor.

In accordance with another aspect of this invention, it is possible to construct transistors which each have a single emitter and a single collector or to construct transistors having pluralities of emitters and collectors within a single isolation diffusion.

Advantageously, where a transistor comprises a plurality of emitters and/or collectors, similar electrodes may be selectively interconnected to increase the current carrying capacity of the transistor or like electrodes, e.g., the emitters alone may be electrically interconnected and the other type electrode, e.g., the collectors, utilized in separate circuits. Additionally, such pluralities of emitters and collectors may be used in independent input and output circuits.

DETAILED DESCRIPTION

Figure 3:
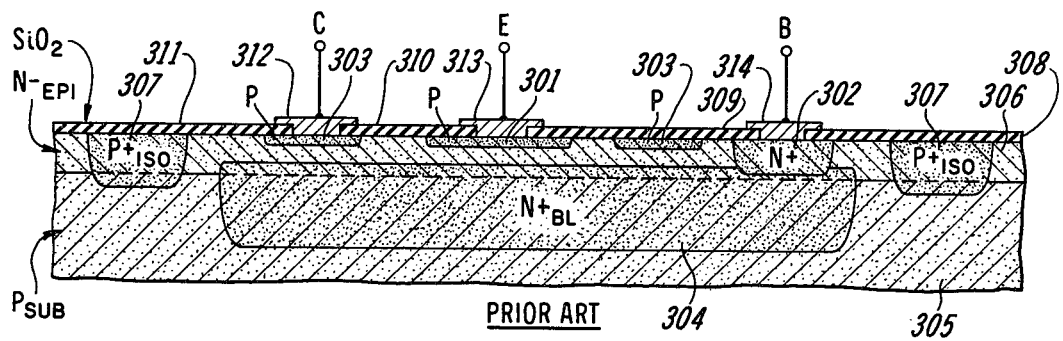
FIG. 3 is a cross section of a physical embodiment of a typical prior art PNP transistor such as shown schematically in FIG. 1.
Figure 4:
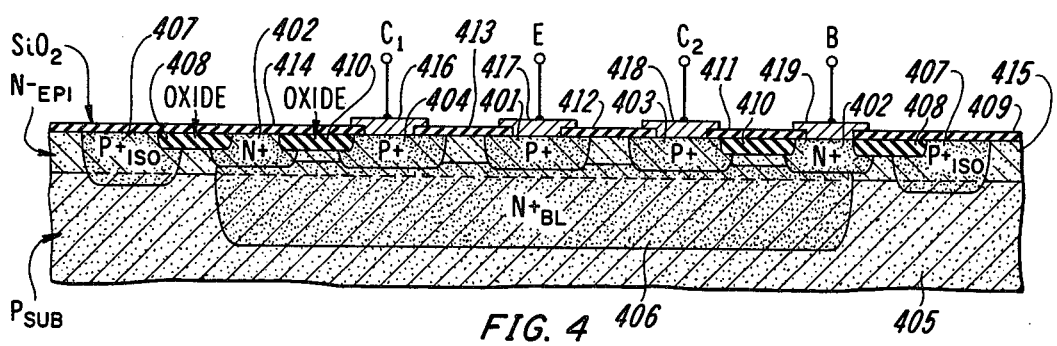
FIG. 4 is a cross section of a first embodiment of an isolated PNP transistor in accordance with the present invention.

The illustrative prior art of FIG. 3 is illustrated as comprising a transistor having a single collector 303 and in FIG. 4 an illustrative embodiment of the present invention is shown as comprising a transistor having two collectors, namely, 403 and 404. Furthermore, in FIGS. 8 and 10 further illustrative embodiments of the present invention are shown as each comprising a transistor having a single collector 807 and 1012, respectively. Although not shown in this application, there are priorly known transistor structures which comprise multiple emitters/collectors and although only two collectors are shown in illustrative embodiments of the present invention, transistors having additional collectors and/or emitters may be constructed in accordance with the present invention.

Both the prior art arrangement of FIG. 3 and the illustrative embodiments of the remaining FIGS. of the drawing are constructed in a semiconductor body which comprises a substrate whose bulk is largely of one conductivity type and an initially uniform epitaxial layer on one surface thereof. In the FIG. 3 device the $n+$ buried layer 304 is diffused into the p-type substrate 305 prior to the growth of the initially n-type epitaxial layer 306. Accordingly, as illustrated in FIG. 3, as processing of the chip proceeds, impurities from the $n+$ buried layer tend to diffuse upwardly into the epitaxial layer 306 thereby increasing the conductivity of the adjacent portion of the epitaxial layer and effectively moving upwards the boundary of the $n+$ buried layer. FIG. 3 illustrates a ring dot configuration wherein the p-type ring collector 303 and the p-type emitter dot 301 comprise shallow p-type diffusions in the epitaxial layer 306, such p-type diffusions being of the type used typically to form the base of a vertical NPN transistor. The ring 303 may be frame shaped of any geometric pattern, e.g., toroidal, rectangular. Access to the p-type collector ring 303 for electrical contact is via the metallization 312, which occurs at the surface of the expitaxial layer overlying a portion of the ring 303. Electrical access to the emitter 301 is via the metallization 313, which overlies the emitter, and electrical access to the base is via the deep $n+$ diffusion 302 which penetrates to the $n+$ buried layer and the surface metallization 314 which overlies the $n+$ diffusion. The active base of this prior art transistor comprises a portion of the epitaxial layer 306 lying intermediate the collector ring 303 and the emitter dot 301. The metallization 314, the $n+$ diffusion 302, and the $n+$ buried layer 304 provide a relatively low resistance path to the active base portion of the epitaxial layer 306. The oxide layer 311 overlies the epitaxial layer 306 and has apertures therein to accommodate the surface metallization as described above herein. As seen in FIG. 3 the deep isolation region p-type 307 which penetrates completely layer 306 to p-type material, the n+ contacting diffusion 302, and the transistor collector and emitter regions, 301 and 303, extend different distances from the surface of the epitaxial layer. Accordingly, although the emitter and collector regions can be introduced in one processing step, the isolation region 307 and the n+ collecting region 302 must be introduced in two additional processing steps. Additionally, as shown in FIG. 3 there are regions of the epitaxial layer 305 underlying the collector and emitter regions 303 and 301 and these underlying regions disadvantageously can collect minority carrier charge which tends to increase response time and reduce transistor gain. Additionally, the active collector and emitter regions 301 and 303 are moderately doped and this tends to limit transistor efficiency.

In contrast to this prior art structure of FIG. 3, each of the structures shown in cross section in FIGS. 4, 6, 8, 10, and 12 when constructed alone can be manufactured with at least one less diffusion processing step and in each structure there are no regions to collect the undesirable charge; additionally, each transistor electrode (emitter and collector) is heavily doped thereby improving transistor efficiency.

Figure 1:
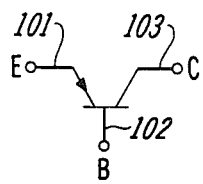
FIG. 1 is a schematic diagram of a PNP transistor having a single collector.
Figure 2:
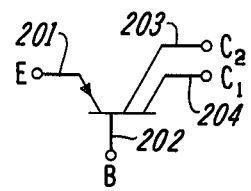
FIG. 2 is a schematic diagram of a PNP transistor having two collectors.
Figure 5:
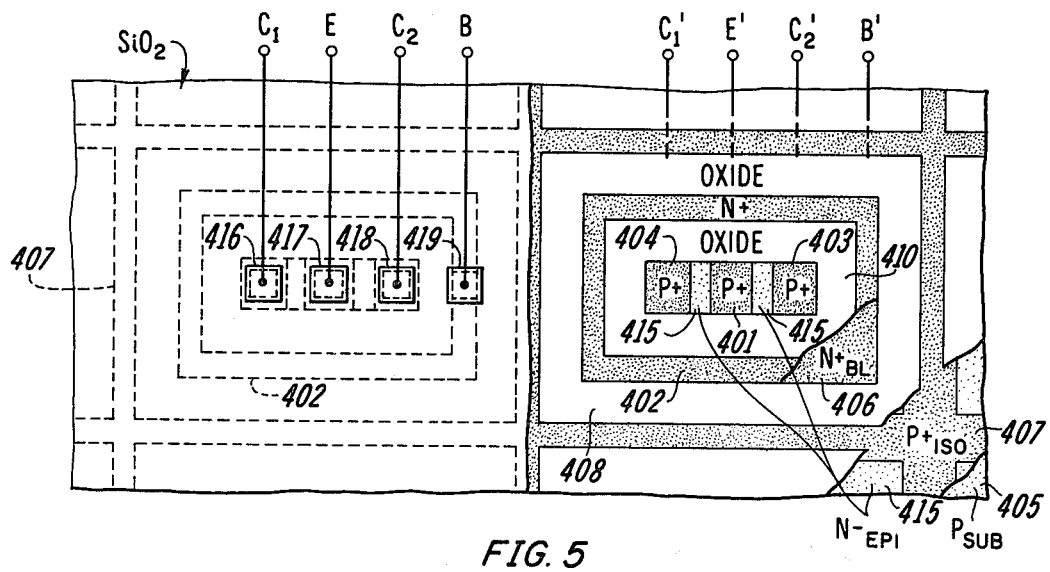
FIG. 5 comprises two top views of a transistor in accordance with FIG. 4.

FIGS. 4 and 5 show a cross section and a top view respectively of a multiple collector transistor such as that illustrated schematically in FIG. 2 and constructed in accordance with the present invention. In this embodiment the collector and emitter electrodes are rectangular or stripe shaped regions as viewed from the surface of the epitaxial layer 415. As in the prior art, the body comprises a p-type substrate 405, an n-type layer 406 diffused therein, and an n-type epitaxial layer 415 overlying the substrate. In this illustrative embodiment contact to the n+ buried layer 406 is via the frame shaped n+ region 402, which surrounds the emitter and collector regions and overlaps the boundaries of the buried layer. As will be seen with respect to the structures of FIGS. 6 and 10, this shape is an optional element of the invention. As will be discussed with respect to each of the illustrative embodiments of the present invention, the collector and emitter electrodes, e.g., 403, 404, and 401 of FIG. 4, are formed in the same processing step that is used to form the frame shaped isolation region 407 which extends from the surface of the epitaxial layer and penetrates to the p-type substrate outside the n+ buried layer 406. Accordingly, the doping levels of the p-type impurity in the p+ isolation region 407 and in the emitter and collector electrodes 401, 403, and 404 are substantially identical. Since the p-type emitter and collector electrode regions 401, 403, and 404 intersect the heavily doped n+ buried layer 406, there are no lightly doped regions underlying the emitter and collector electrodes in which unwanted charge can collect.

Electrical access to the emitter and collector regions 401, 403, and 404 is by way of the independent surface metallizations 418, 417, and 416 respectively. Typically, the substrate 405 has electrical connections, not shown in the drawing, to which is applied a potential which is more negative than any potential supplied to the elements of the transistor.

The two deep oxide regions, 408 and 410, which respectively isolate the n+ connecting ring 402 from the p+ isolation region 407 and from the transistor electrode regions 403 and 404, are provided. In the illustrative embodiment of FIG. 4 the deep oxide regions 408 and 410 serve to reduce capacitance between the structural elements and to increase the breakdown potential between such elements. The deep oxide region 408 is operative between the n+ connecting region 402 and the p+ isolation region 407; and the deep oxide region 410 is operative between the n+ connecting region 402 and the transistor electrode regions 403, 401, and 404. Elimination of these capacitances serve to decrease response time of the transistor and the increase in breakdown voltage permits operation with desirable signal levels. As will be seen in other illustrative embodiments of the invention, such deep oxide regions additionally serve to reduce parasitic transistor action. The surface oxide layers 409, 411, 412, 413, and 414 provide an insulating layer in which apertures are cut to receive the surface metallization, e.g., the base metallization 419, the collector metallizations 416, 418, and the emitter metallization 417.

Transistors in accordance with this and the other illustrative embodiments shown herein are formed by a process which proceeds with respect to a semiconductor body which comprises a substrate 405, an epitaxial layer 415 formed on the substrate and one or more n+ buried layers 406. The processing steps may comprise the following:

1. Formation of the deep oxide regions 408, 410;
2. Formation of an oxide layer over the surface of the chip and establishment of apertures in the oxide layer over the regions to be processed in the following step;
3. Diffusion of selected regions, e.g., diffusion of the isolation region 407 and of the transistor electrode regions 401, 403, and 404 in a common step;
4. Establish surface oxide layer with apertures therein to accommodate the next succeeding processing step;
5. Diffusion of the remaining regions, e.g., the n+ connecting region 402; (Steps 3 and 5 may be interchanged in time sequence without affecting the final structure.)
6. Establish surface oxide layer with apertures therein to receive the surface metallization, e.g., 416, 417, 418, and 419;
7. Application of metallization to the regions defined in Step 6.

FIG. 5 comprises two plan views of a transistor in accordance with the illustrative embodiment of FIG. 4. On the left side of FIG. 5, the transistor is viewed from the surface wherein the elements of the structure are shown by dotted lines; and on the right side of FIG. 5 successive layers are exposed to give a further representation of the construction of isolated transistors in accordance with the embodiment of FIGS. 4 and 5.

Figure 6:
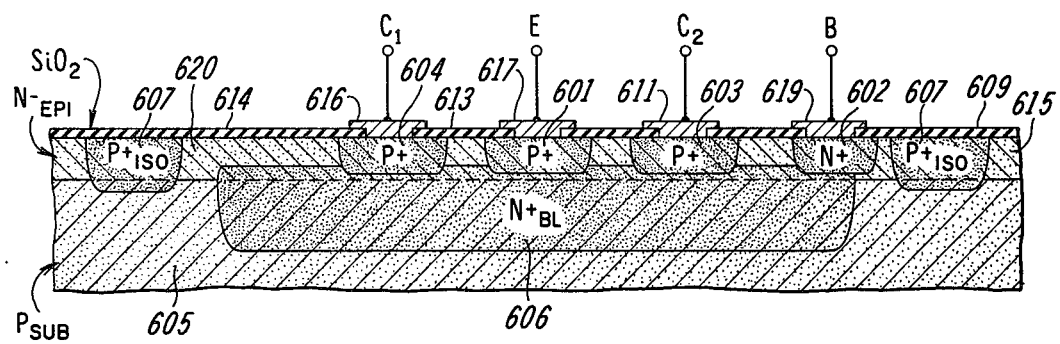
FIG. 6 is a cross section of a second embodiment of a transistor in accordance with this invention.
Figure 7:
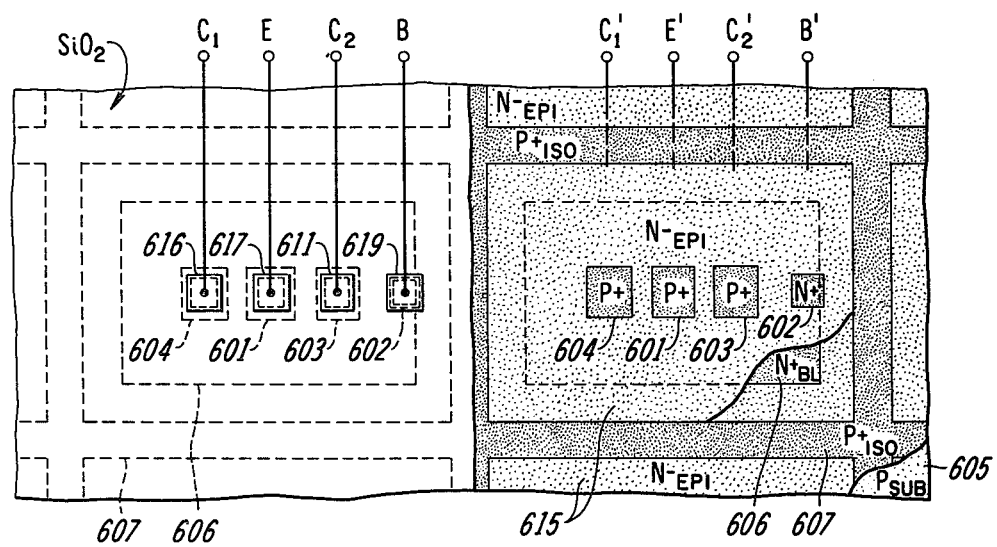
FIG. 7 comprises two top views of a transistor in accordance with FIG. 6.

A second illustrative embodiment of an isolated multiple collector transistor in accordance with the present invention is shown in cross section in FIG. 6 and in plan view in FIG. 7. This specific embodiment departs from the embodiment of FIGS. 4 an 5 in the provision of a dot shaped n+ connecting region 602 rather than a frame shaped connecting region such as 402 shown in FIGS. 4 and 5. In the illustrative embodiment of FIGS. 4 and 5 the frame shaped connecting region 402 because of its high doping level effectively eliminates parasitic transistor action between the isolation region 407 and the adjacent transistor electrode regions, e.g., the collector regions 403 and 404. In FIG. 6 the absence of the n+ connecting region between the collector region 604 and the isolation region 607 results in a parasitic transistor which comprises: p+ region 604, a portion 620 of the epitaxial layer 615, and a portion of the isolation region 607. Such parasitic transistors serve to reduce the gain of the lateral PNP structure, however, they may be purposely included in the transistor design as a means of limiting saturation of the transistor. As in FIGS. 4 and 5 the isolated transistor of FIGS. 6 and 7, is formed in a semiconductor body which comprises a p-type substrate 605, wherein at least one buried layer, e.g., 606 has been established, and an n− epitaxial layer 615 has been grown over the surface of the substrate. The n+ connecting dot 602 is established in one diffusion process and the remaining diffusions, namely, the p+ isolation region 607 and the p+ transistor electrodes 603, 601, and 604 are grown in another diffusion step. Electrical access to the substrate 605 is by metallization not shown, and access to the connecting region 602 and to the transistor electrode regions 603, 601, and 604 is respectively by the surface metallizations 619, 611, 617, and 616. The surface oxide layer 609 is provided for insulation as is the surface oxide layer 409 of FIG. 4.

The plan view at the left side of FIG. 7 illustrates the structure of FIG. 6 as viewed from the surface and the plan view at the right of FIG. 7 shows the structure of FIG. 6 with successive layers removed.

The processing of the body to achieve the structure of FIGS. 6 and 7 is basically the same as that described above herein with respect to the structure of FIGS. 4 and 5, however, the step which forms the deep oxide regions is eliminated in this process.

Figure 8:
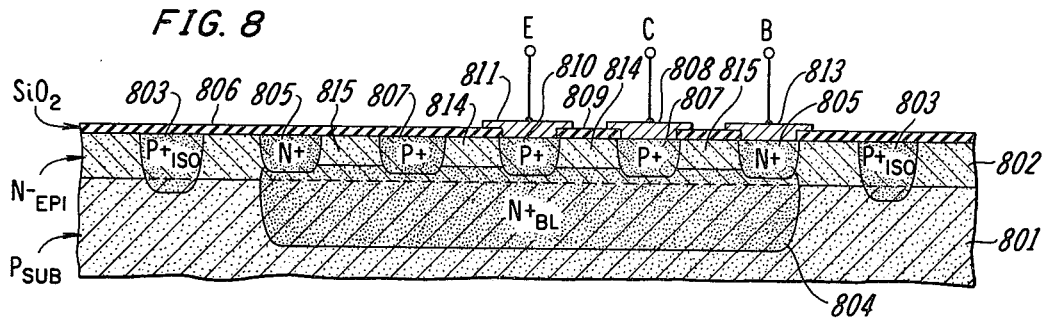
FIG. 8 is a cross section of a third embodiment of a transistor in accordance with this invention.
Figure 9:
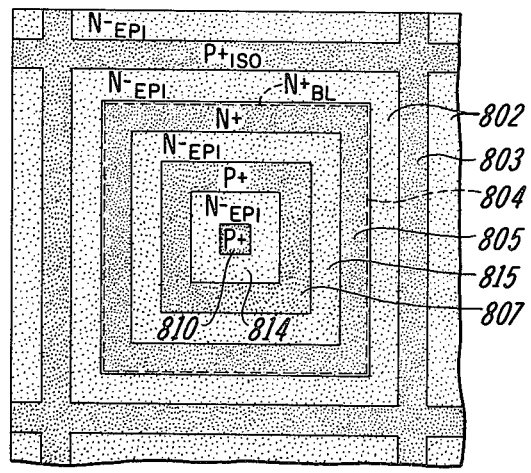
FIG. 9 is a top view of a transistor in accordance with FIG. 8.

FIGS. 8 and 9 show another illustrative embodiment which comprises a transistor formed in a ring-dot configuration and wherein a frame shaped n+ connecting region is utilized. This illustrative embodiment is shown without the inclusion of any deep oxide regions, however, such deep oxide region may be selectively provided between the n+ connecting region 805 and the isolation region 803 and between the n+ connecting region 805 and the frame shaped collector region 807. Such deep oxide regions would be provided for the same technical reasons given with respect to their use in FIGS. 4 and 5. That is, the deep oxide eliminates intersecting heavily doped regions and therefore reduces inter-element capacitance and such deep oxide regions increase the breakdown potential between elements so separated. The frame shaped n+ connecting region of FIGS. 8 and 9 effectively eliminates parasitic transistor action between the collector diffusion 807, the isolation diffusion 803, and the intervening portion of the epitaxial layer 802. As in the case of the previously described illustrative embodiment, the structure of FIGS. 8 and 9 results from the processing of a semiconductor body which comprises a p-type substrate 801 in which at least one n+ buried layer 804 has been established, and an epitaxial layer 802 grown over the substrate. The n+ connecting region 805 is formed in one diffusion step while the p+ isolation region 803 and the transistor electrode regions 807 and 810 are all formed in a second processing step. Surface oxide region 806 provides insulation at the surface and permits the establishment of the metallizations 811, 808, and 813 for electrically accessing the emitter, collector, and base regions of the embodiment of FIGS. 8 and 9. Again, electrical access to the p-type substrate 801 is by way of metallization not shown.

Figure 10:
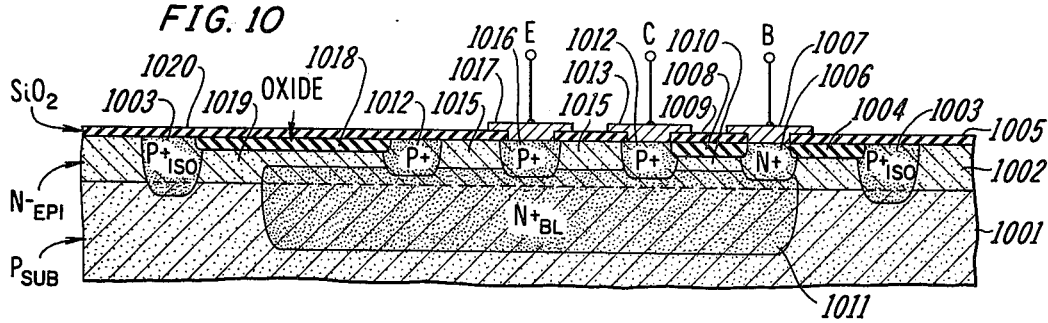
FIG. 10 is a cross section of a fourth embodiment of a transistor in accordance with this invention.
Figure 11:
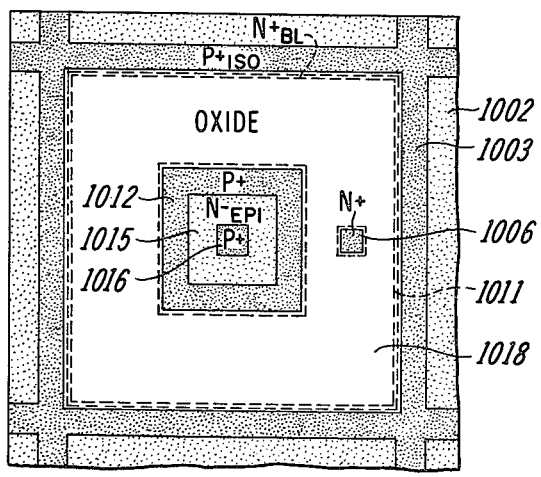
FIG. 11 is a top view of a transistor in accordance with FIG. 10.

The illustrative embodiment of FIGS. 10 and 11 comprises a ring dot transistor configuration wherein a dot shaped n+ connection region is utilized. Additionally, deep oxide regions to reduce inter-element capacitance and to reduce parasitic transistor action while increasing the inter-element breakdown voltages are utilized.

As in the other embodiments illustrated herein, the structure of FIGS. 10 and 11 is formed in a body which comprises a substrate 1001 having an n+ buried layer 1011 therein, and an epitaxial layer 1002 overlying said substrate. The deep p+ isolation region 1003 and the two electrode regions 1012 and 1016 are formed in a single diffusion step. The dot shaped n+ connecting region 1006 and the surface metallization 1007 associated therewith, provide access to the n+ buried layer and thus to the active base region 1015. Electrical access to the emitter region 1016 is by way of the surface metallization 1017 and access to the frame shaped collector region 1012 is by way of the surface metallization 1013. The surface oxide region 1020 provides insulation which permits application of the surface metallizations. The deep oxide region 1018 in the epitaxial layer 1002 intermediate the p-type isolation region 1003 and the p-type collector region 1012, serves to reduce the parasitic transistor action involving these p-type regions and the intermediate portion 1019 of the epitaxial layer 1002. The deep oxide region 1004 reduces the capacitance between the n+ connecting dot 1006 and the isolation region 1003; and the deep oxide region 1008 reduces the capacitance between the n+ connecting dot 1006 and the collector ring 1012. Additionally, each of these deep oxide regions increases the breakdown voltage between the elements separated by the oxide regions.

The structure of the illustrative embodiment of FIG. 10 is shown in plan view in FIG. 11. The manufacture of this illustrative embodiment follows the same steps outlined with respect to the illustrative embodiment of FIGS. 4 and 5.

Figure 12:
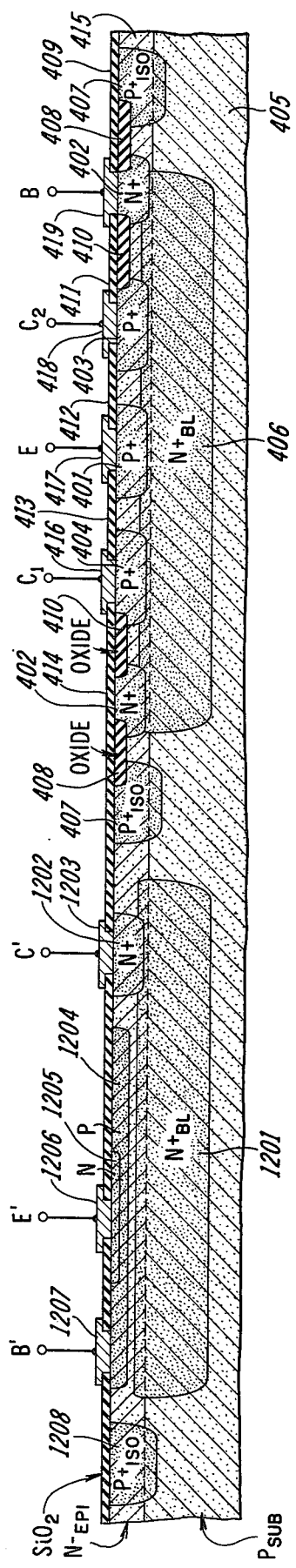
FIG. 12 is a cross section of a transistor in accordance with this invention along with an isolated independent NPN transistor.

In FIG. 12 there is shown an isolated multiple collector (or multiple emitter) lateral PNP transistor of the embodiment shown in FIGS. 4 and 5 on a substrate and having adjacent thereto an isolated vertical NPN transistor. The PNP transistor at the right side of FIG. 12 is labeled the same as the cross section of FIG. 4 and the description of FIG. 4 applies equally as well to this portion of FIG. 12. That portion of the isolation region 407 to the left of the multicollector transistor of FIG. 12 is shared by that multicollector transistor and the vertical NPN transistor shown at the left of FIG. 12. The vertical NPN transistor is formed over an additional n+ buried layer 1201 formed in the substrate prior to the growth of the epitaxial layer 415. The p+ isolation diffusion 1208 to the left of the vertical NPN transistor is formed in the same step as the isolation region 407 and the p+-type transistor zones 401, 403, and 404. Similarly the n+ collector connecting region 1202, which is dot shaped in this embodiment, is formed in the same diffusion step as the n+ connecting ring 402 of the lateral PNP transistor. The p-type base diffusion 1204 and the n-type emitter diffusion 1205 are formed in process steps separate from those steps utilized to form the isolation regions and the electrode regions of the lateral transistor. Accordingly, the structure and electrical parameters of the lateral and vertical transistors can be independently controlled in manufacture. The surface metallization which provides access to the base, emitter, and collector regions 1204, 1205, and 1202 may be formed in the same step as the metallization which is applied to the electrodes of the lateral PNP transistor. As seen in FIG. 12, lateral PNP transistors and vertical NPN transistors can be formed in a common body utilizing several of the processing steps in common. Although not enumerated in the above description of FIG. 12, it should be noted that the successive surface oxide coatings which are utilized in the course of manufacture can be used in common in the construction of the lateral PNP and the vertical NPN transistors.

Several embodiments of lateral transistors in accordance with the present invention have been illustrated herein, however, it is apparent that other variations of these structures may be constructed without departing from the spirit and scope of the invention.

What is claimed is:

1. A semiconductor structure comprising a bulk region which is largely of one conductivity type; a relatively lightly doped first region of largely the opposite conductivity type overlying said bulk region;
    a relatively heavily doped buried tub of said opposite conductivity type vertically interposed between said bulk region and said first region;
    a relatively heavily doped frame shaped base contact region of said opposite conductivity type extending from the exposed surface of said first region to said buried tub region to provide electrical access to said buried tub;
    a relatively heavily doped frame shaped isolation region of said one conductivity type spaced apart from said base contact region and extending from the exposed surface of said first region to said bulk region outside of said buried tub;
    a plurality of relatively heavily doped spaced apart emitter/collector regions of said one conductivity type encircled by said base contact region and extending from the exposed surface of said first region to said buried tub; oxide regions extending from the exposed surface of said first region towards said bulk region interposed laterally between said isolation region and said base contact region region and between said base contact region and said emitter/collector regions;
    and means for electrically connecting individually to said base contact region, and said electrode regions.

2. A structure in accordance with claim 1 wherein one of said plurality of emitter/collector regions is frame shaped and proportioned to maintain substantially uniform lateral spacing between said emitter/collector region and another of said emitter/collector regions encircled by said frame shaped emitter/collector region.

3. A structure in accordance with claim 1 wherein said emitter/collector regions as viewed from the exposed surface of said first region are stripe shaped.

4. A semiconductor structure comprising a bulk region which is largely p-type; a largely $n-$ first region overlying said bulk region; an $n+$ buried tub interposed vertically between said bulk region and said first region; an $n+$ frame shaped base contact region extending from the exposed surface of said first region to said buried tub to provide electrical access to said buried tub; a $p+$ frame shaped isolation region spaced apart from said base contact region and extending from the exposed surface of said first region to said bulk region outside of said buried tub;
    a plurality of $p+$ spaced apart emitter/collector regions encircled by said base contact region and extending from said exposed surface of said first region to said buried tub and formed in the same processing steps as said isolation region;
    oxide regions extending from the exposed surface of said first region towards said bulk region interposed laterally between said isolation region and said base contact region and between said base contact region and said emitter/collector regions;
    and means for electrically connecting individually to said base contact region, and said emitter/collector regions.

* * * * *